US006617983B1

(12) United States Patent
Platz

(10) Patent No.: US 6,617,983 B1
(45) Date of Patent: Sep. 9, 2003

(54) GLASS KEYBOARD, AND METHOD FOR PRODUCING A GLASS KEYBOARD

(76) Inventor: Karl-Otto Platz, Eckenhagener Strasse 16, 51580 Reichshof (DE)

( * ) Notice: Subject to any disclaimer, the term of this patent is extended or adjusted under 35 U.S.C. 154(b) by 0 days.

(21) Appl. No.: 09/623,880

(22) PCT Filed: Mar. 10, 1999

(86) PCT No.: PCT/EP99/01568

§ 371 (c)(1), (2), (4) Date: Nov. 21, 2000

(87) PCT Pub. No.: WO99/46789

PCT Pub. Date: Sep. 16, 1999

(30) Foreign Application Priority Data

Mar. 11, 1998 (DE) .......................................... 198 10 326

(51) Int. Cl.[7] ........................ H03K 17/94; H03M 11/00
(52) U.S. Cl. .......................... 341/34; 345/173; 200/512
(58) Field of Search ..................... 341/34, 22; 345/173; 200/512, 5 A

(56) References Cited

U.S. PATENT DOCUMENTS 4,975,676 A * 12/1990 Greenhalgh ................. 200/5 A
5,144,567 A * 9/1992 Oelsch et al. ................. 341/22
5,228,562 A * 7/1993 Burk .......................... 200/512

* cited by examiner

*Primary Examiner*—Timothy Edwards
(74) *Attorney, Agent, or Firm*—Diller, Ramik & Wight

(57) ABSTRACT

In a glass keyboard comprising a keyboard surface (4) made from a flexible thin glass pane (2) and at least one carrier material pane (6), each pane being provided with an electroconductive layer (8,10) on the faces facing each other, wherein the opposing electroconductive layers (8,10) are kept at a distance to each other with the aid of a spacer (12), and wherein the electroconductive layers (8,10) touch each other when pressure is applied to the flexible thin glass layer (2) at the essentially localized place of pressure application, it is provided that the electroconductive layers (8,10) on the thin glass pane (2) and the carrier material pane (6) are connected with conductors (62,66) which are led out at a side edge of the keyboard surface (4), that a flexible flat multiple cable (64,68) is connected with the conductors (62,66) of the electroconductive layers (8,10) via contacts (74,75), and that the flat multiple cable (64,68) comprising the contacts (74,75) is arranged between the thin glass pane (2) and the carrier material pane (6).

19 Claims, 2 Drawing Sheets

FIG. 3
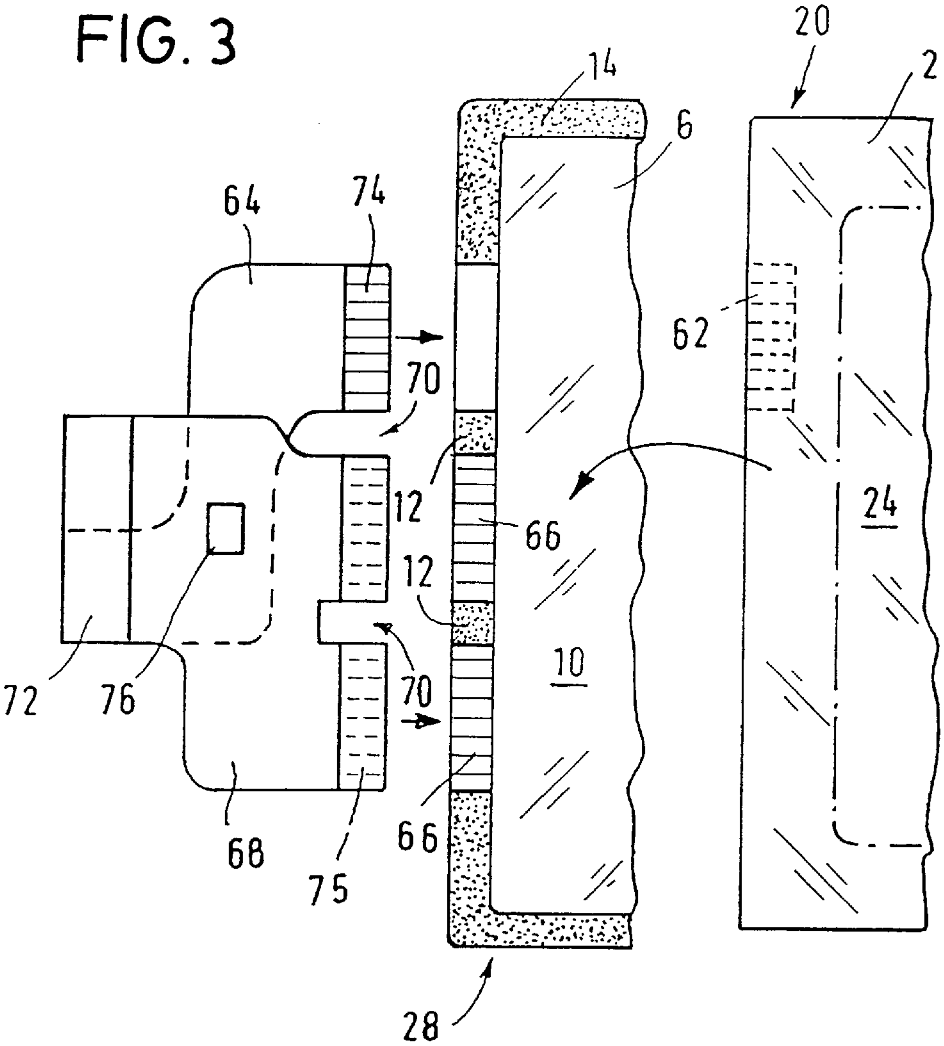
FIG. 4
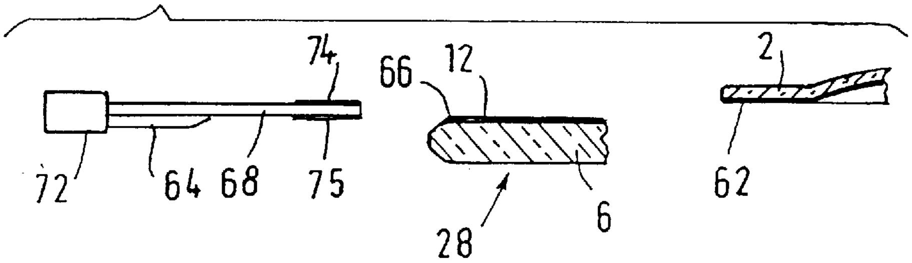
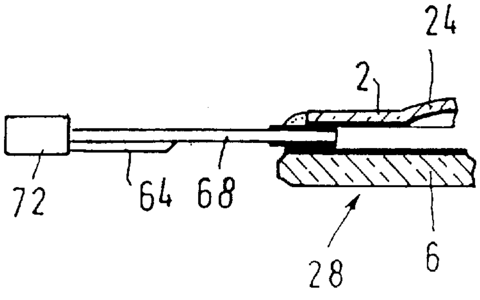
FIG. 5

GLASS KEYBOARD, AND METHOD FOR PRODUCING A GLASS KEYBOARD

The present invention relates to a glass keyboard and to a method for producing a glass keyboard.

BACKGROUND OF THE INVENTION

Such pressure switch elements are known as touch panels in displays. The touch panels are normally made from transparent plastic films whose inner surfaces are coated with an electroconductive material. To support said films spacers are glued in the air gap, wherein a spacer arranged around the outside of the contact area is bonded in an airtight manner to the plastic films to stabilize the inside air pressure thus supporting the upper film. Inside the contact area elastic spacers are additionally provided which ensure return movement of the films. It is a drawback of the known pressure switch element that it requires a hermetically sealed air space which does not allow for any pressure compensation. In the event of considerable deviation from the normal atmospheric pressure, e.g. during application in submarine vehicles or in aeronautics and space operations, and at high temperatures hairline cracks occur in the vapour-deposited electroconductive contact layer due to the changes in air pressure, which results in a failure of the unit. At large heights the spacer in the contact area expands. This changes the switching path of the contact film, and the given electronical and mechanical parameters, such as the action point, are no longer complied with. Further drawbacks of the known touch panels are that the plastic films present only a limited mechanical and chemical resistance, a-small degree of transmission and are not antistatic. Further, in the event of temperature variation there is the danger of crack formation in the electroconductive layer due to fact that the expansion coefficients of the conductive layer and the plastic carrier considerably differ from each other.

From EP 0 546 003 B1 a pressure switch element made from a glass laminate is known which comprises a flexible thin glass pane and at least one carrier glass pane, each pane being provided with an electroconductive layer on the faces facing each other. The opposing electroconductive layers are kept at a distance to each other with the aid of a spacer. The electroconductive layers touch each other when pressure is applied to the flexible thin glass layer at the essentially localized place of pressure load application.

With regard to this type of pressure switch element it is common practice to provide the electrode connections of the electroconductive layers at a protruding edge of the carrier material pane.

For this purpose the electroconductive layer on the thin glass pane is bonded to the thicker carrier glass pane via an electroconductive spacer and then glued to a flexible multiple cable at the protruding edge. It is a drawback that microcracks occur due to the membrane effect of the thin glass pane when pressure is applied to the electroconductive spacer, which may lead to malfunction.

SUMMARY OF THE INVENTION

It is the object of the invention to provide a glass keyboard which can be produced at less expenditure and presents high contact reliability with regard to the electrical connections.

According to the invention the electroconductive layers on the thin glass pane and the carrier material pane are preferably connected with conductors which are led out at a side edge of the keyboard surface, that a flexible flat multiple cable is electrically connected with the conductors on the thin glass pane and the carrier material pane, and that the flat multiple cable is arranged between the thin glass pane and the carrier material pane.

In this way the conductors of the thin glass pane are bonded in a protected area within the glass keyboard with the flat multiple cable being insulatingly coated on the side averting the conductors.

The invention further provides a method for producing glass keyboards where a thin glass pane is glued at a distance to the carrier material pane with a flat multiple cable being connected,-simultaneously on two planes, in a contact-proof and break-proof manner with the electroconductive layers.

Preferably a first flat multiple cable is electroconductingly glued to the thin glass pane while a second flat multiple cable is electroconductingly glued to the carrier material pane. On each rear side the film-type flat multiple cable is insulated.

The thickness of the film-type flat multiple cable corresponds to the thickness of the spacer preferably made up of an adhesive arranged between the thin glass pane and the carrier material pane such that the flat multiple cables may preferably be inserted at a side edge of the glass keyboard so as to act as spacers.

The flat multiple cables are arranged at a lateral distance to each other between the thin glass pane and the carrier material pane. The gaps are filled with an adhesive, preferably a plastic material cured under UV-light.

Between the contacts connected with the conductors of a flat multiple cable, too, recesses may be left. Said recesses are also filled with an adhesive cured under UV-light. Due to the glueing in the recesses and the gaps mechanical pressure in this area of the thin glass pane does not lead to cracking of the glass since the adhesive serves as a spacer and further compensates for different film material thicknesses of the flat multiple cables.

The flat multiple cables are connected at their free ends with a multiple plug connector. A microprocessor may be integrated in the flat multiple cables or in the multiple plug connector.

According to a preferred aspect the carrier material pane is slightly larger than the flexible thin glass pane such that the marginal area of the carrier material pane protrudes beyond the the marginal area of the thin glass pane. The protruding marginal area of the carrier material pane protects the sensitive marginal edge of the thin glass pane, which can further reduce the danger of breakage of the thin glass pane.

The the flat set back margin of the thin glass pane is glued to the marginal area of the carrier material pane by means of an adhesive acting as a spacer in the marginal area. The protruding margin of the carrier material pane is further adapted to receive an adhesive build-up which also protects the sensitive edge of the thin glass pane.

Preferably the margin of the thin glass pane is stabilized by means of a cured plastic material. The cutting edge of the thin glass pane displays a plurality of microcracks which occur during the cutting process and extend from the edge to the inside. Said microcracks may easily result in a crack which destroys the entire thin glass pane. The margin of the thin glass pane is therefore preferably stabilized by means of a cured plastic material. For this purpose the boundary edges of the thin glass pane are dipped into a liquid plastic material. Due to the capillary effect the microcracks are filled with the liquid plastic material whereafter the plastic material cures. When the plastic material is cured, the thin glass pane offers a considerably higher stability since breaking of the thin glass pane starting from its margins can no longer occur in the event of pressure or shock load.

The thickness of the thin glass pane ranges between approximately 0.1 and 0.5 mm, preferably between approximately 0.175 and 0.4 mm. A thin glass pane of such a thickness offers an adequate flexibility to allow for localized switching contact between opposing electroconductive layers.

The spacer is arranged exclusively in the marginal area of the keyboard surface between the thin glass pane and the carrier material pane, wherein in the remaining portion of the keyboard surface switching operations can be performed formed at any location without further spacers being provided. The invention preferably makes additional spacers in the area of the switching section superfluous such that the overall keyboard surface is available for switching operations without any limitations.

In a preferred embodiment the spacer in the marginal area is made from a plastic material cured under UV-light. This offers the advantage that no separate spacer has to be provided, and that the spacer can already be formed when the thin glass pane is glued to the carrier material pane.

The carrier material pane and/or the spacer comprise in the marginal area vent openings for the space between the thin glass pane and the carrier material pane. This offers the advantage that pressure compensation is possible in the event of deviation from the normal atmospheric pressure, e.g. during application in submarine vehicles or in aeronautics and space operations, and at high temperatures such that the electroconductive layers on the thin glass pane and the carrier material pane are prevented from being damaged.

The vent openings are preferably provided with a filter material protecting the glass keyboard from soiling.

Further preferred features of the invention are stated in the subclaims.

Hereunder embodiments of the invention are explained in detail with reference to the drawings in which:

BRIEF DESCRIPTIONS OF THE DRAWINGS

FIG. 3 shows a side edge of the glass keyboard with conductor connections,

FIG. 4 shows the glueing together of the glass keyboard, and

FIG. 5 shows a flat multiple cable acting as a spacer between thin glass pane and carrier material pane.

DESCRIPTION OF THE PREFERRED EMBODIMENTS

Figure 1:
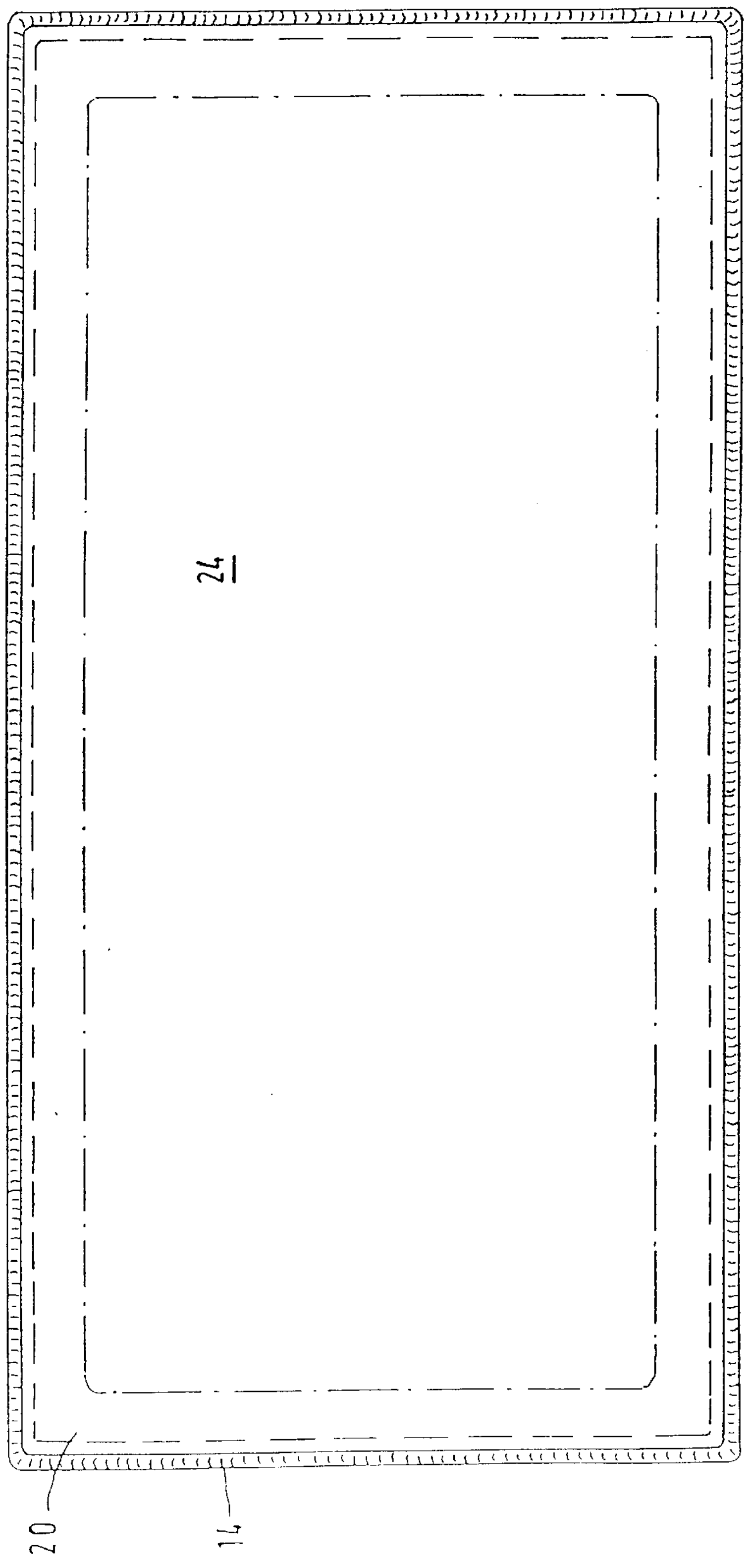
FIG. 1 shows the glass keyboard according to the invention.
Figure 2:
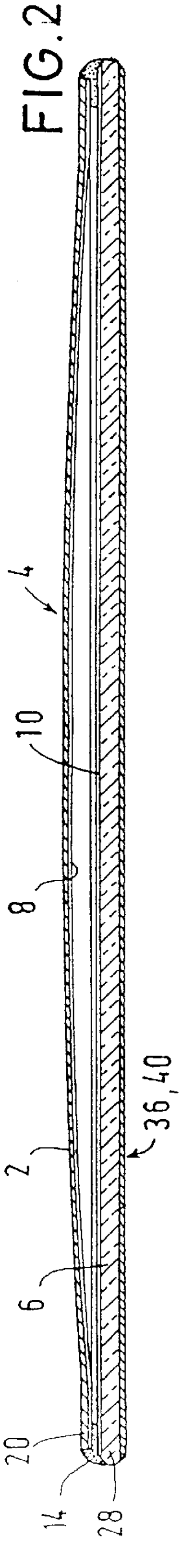
FIG. 2 shows a cross-section of the glass keyboard of shown in FIG. 1.

The glass keyboard shown in FIGS. 1 and 2 comprises a relatively thick lower carrier material pane 6 and a thin glass pane 2 kept at a parallel distance to the carrier material pane 6 with the aid of a spacer 12. The thin glass pane 2 and the carrier material pane 6 are provided with electroconductive layers 8,10 on the opposing inner faces, the electroconductive layers 8,10 forming electrodes and establishing a switching contact when the layers touch each other. For this purpose the flexible thin glass pane 2 may be deformed by essentially localized pressure application such that an electric contact is established between the conductive layers 8,10.

Such a configuration of the glass keyboard can be employed for both analog glass keyboards where the electroconductive layers 8,10 essentially cover the entire keyboard surface 4, and digital glass keyboards where the electroconductive layers 8,10 are structured and comprise e.g. a plurality of conductors arranged parallel to each other. The conductors on the electroconductive layer 8 are preferably arranged at right angles to the conductors on the electroconductive layer 10. For the purpose of simplification only the connections 62,66 of the conductors are shown in the drawings.

The thin glass pane 2 is cut out of a drawn thin glass film and has a thickness ranging, between approximately 0.1 and 0.5 mm, preferably between approximately 0.175 and 0.4 mm. Float glass of the same thickness comprises a tin film which leads to embrittlement of the glass and is thus not suitable for this application. Only thin glass panes produced from a drawn glass film have an adequate flexibility and breaking strength which allow even larger keyboard surfaces 4 to be produced. Further, the glass thickness must be uniform to a high degree.

The thin glass pane 2 has a slight convexity to the outside and is glued in this condition to the carrier material pane 6 using the spacer 12. For this purpose the thin glass pane 2 is deep drawn with there remaining a flat marginal area 20. The spacer is preferably formed by the adhesive glueing the two panes 2,6 together with glueing being carried out only at the edge of the marginal area 20 of the thin glass pane 2. The carrier material pane 6 protrudes on all sides beyond the thin glass pane 2 thus allowing for effective protection of the sensitive outer edges of the thin glass pane 2. At the same time the protruding margin of the carrier material pane 6 forms a supporting surface for an adhesive build-up 14 which reaches up to the upper edge of the thin glass pane 2. Said adhesive build-up 14 additionally protects the sensitive outer edge of the thin glass pane 2.

The convexity of the thin glass pane 2 to the outside offers the advantage that higher return movement forces are produced, and that the thin glass pane 2 does not require further spacers to be arranged in the area of the keyboard surface 4. It is important that no spacers are provided in the switching area 24 of the keyboard surface 4 since it would not be possible to establish a switching contact in the area of such spacers. The glass keyboard described here can be operated at any location of the keyboard surface 4.

Another advantage of the convexity of the thin glass pane 2 to the outside is that the formation of Newton's rings, which are undesired in transparent keyboards, is prevented.

The thin glass pane 2 may be edge-stabilized. Edge stabilizing is realized by dipping the cutting edges of the thin glass pane 2 cut out of a drawn thin glass film into a highly viscous curable plastic material. The adhesive has several functions, i.e. it acts as a spacer 12 between the thin glass pane 2 and the carrier material pane 6, it acts as edge stabilizer-by penetrating the microcracks in the edge area 20 of the thin glass pane 2, and it acts as outer edge protection for the thin glass pane 2 by forming an adhesive build-up 14 on the protruding margin of the carrier material pane 6. The adhesive build-up 14 is preferably produced in a second working cycle.

The margin of the carrier material pane 6 protrudes beyond the outer edges of the thin glass pane 2 by e.g. approximately 1 mm thus forming, in conjunction with the adhesive build-up 14, an effective protection against shocks on the outer margin of the glass keyboard.

A plastic material curing under UV-light is preferably used as adhesive. Such an adhesive offers the advantage that the time of curing can be exactly controlled, which considerably facilitates the production process.

FIG. 3 shows the side edges of the carrier material pane 6 and the thin glass pane 2 with the conductors 62,66 ending in the edge areas 20 and 28 respectively, the conductors 62,66 forming the connecting lines of the electroconductive layers 8,10.

The conductors 62,66 may be glued to connecting contacts 74,75 at the end of flexible film-type flat multiple cables. As shown in FIG. 3 one flat multiple cable 64,68 each is preferably provided for both the carrier material pane 6 and the thin glass pane 2. It is however also possible to provide only one film-type flat multiple cable comprising contacts 74,75 at both ends such that only one flat multiple cable can be bonded both to the thin glass pane 2 and the carrier material pane 6. In this connection it may be envisaged that in the case of opposing contacts 74,75 the contacts for the thin glass pane 2 are insulated from the contacts 75 for the carrier material pane 6 by means of an insulating intermediate layer.

In the embodiment shown in FIG. 3 the flat multiple cable 64 is electroconductingly glued to the thin glass pane 2 while the flat multiple cable 68 is electroconductingly glued to the carrier material pane 6. Preferably the flat multiple cables 64,68 are glued to the respective pane 2,6 prior to joining the carrier material pane 6 and the thin glass pane 2. In a second step the two panes 2,6 are then glued to each other in the usual manner. The recesses 70 are filled with adhesive which forms a spacer together with the bonding ends of the flat multiple cables 64,68.

Although a preferred embodiment of the invention has been specifically illustrated and described herein, it is to be understood that minor variations may be made in the apparatus without departing from the spirit and scope of the invention, as defined the appended claims.

The flat multiple cables 64,68 are connected to a multiple plug connector 72 which may comprise two multipoint connectors adapted to be fitted together such that each flat multiple-cable is connected to a multipoint connector.

A microprocessor 76 may be integrated in the flat multiple cable or in the plug connector, the microprocessor 76 containing a control unit for the glass keyboard.

What is claimed is:

1. A glass keyboard comprising a keyboard surface (4) made from a flexible thin glass pane (2) and at least one carrier material pane (6), each pane being provided on opposing faces with an electroconductive layer (8, 10), the opposing electroconductive layers (8, 10) being kept at a distance from each other by a spacer (12), the electroconductive layers (8, 10) touch each other when pressure is applied to the flexible thin glass pane (2) at an essentially localized area of pressure application, the electroconductive layers (8, 10) on the thin glass pane (2) and the carrier material pane (6) being connected with respective conductors (62, 66) which are led out at a side edge of the keyboard surface (4), flexible flat multiple cables (64, 68) being connected respectively with the conductors (62, 66) of the electroconductive layers (8, 10) via contacts (74, 75),the flat multiple cables (64, 68) and the contacts (74, 75) being arranged between the thin glass pane (2) and the carrier material pane (6), and the flat multiple cables (64, 68) are in side-by-side relationship to each other.

2. Glass keyboard according to claim 1 characterized in that the flat multiple cables (64,68) have a thickness corresponding to the thickness of the spacer (12).

3. Glass keyboard according to claim 1 characterized in that between the contacts (74) connected with the conductors (62,66) of a flat multiple cable (68) recesses (70) are left open.

4. Glass keyboard according to claim 1 characterized in that a microprocessor (76) is integrated in a flat multiple cable (64,68).

5. Glass keyboard according to claim 1 characterized in that the carrier material pane (6) is slightly larger than the flexible thin glass pane (2) such that the marginal area (28) of the carrier material pane (6) protrudes on all sides beyond the marginal area (20) of the thin glass pane (2).

6. Glass keyboard according to claim 1 characterized in that the margin of the thin glass pane (2) is stabilized by means of a cured plastic material (16).

7. Glass keyboard according to claim 1 characterized in that the keyboard surface (4) made from the flexible thin glass pane (2) is of flat configuration in the marginal area (20) and displays a slight convexity-to the outside in the switching area (24).

8. Glass keyboard according to claim 1 characterized in that the thickness of the thin glass pane (2) ranges between approximately 0.1 and approximately 0.5 mm, preferably between 0.175 and 0.4 mm.

9. Glass keyboard according to claim 1 characterized in that the spacer (12) is arranged exclusively in the marginal area (20,28) of the keyboard surface (4) between the thin glass pane (2) and the carrier material pane (6), and that the remaining portion of the keyboard surface is adapted for localized switching at any location without any further spacer being provided.

10. Glass keyboard according to claim 1 characterized in that the spacer (12) in the marginal area is formed by a plastic material curing under UV-light.

11. Glass keyboard according to claim 1 characterized in that at the free end of the flat multiple cables (64,68) a multiple plug connector (72) is connected.

12. Glass keyboard according to claim 11 characterized in that the microprocessor (76) is integrated in the multiple plug connector (72).

13. The glass keyboard according to claim 1 characterized in that the conductors (62) are on the thin glass pane (2), and the conductors (66) are on the carrier material pane (6).

14. Glass keyboard according to claim 13 characterized in that the first flat multiple cable (64) is electroconductingly glued to the thin glass pane (2) and the second flat multiple cable (68) is electroconductingly glued to the carrier material pane (6).

15. Glass keyboard according to claim 13 characterized in that the flat multiple cables (64,68) are arranged at a lateral distance to each other between the thin glass pane (2) and the carrier material pane (6).

16. A method of producing a glass keyboard comprising the steps of providing a keyboard surface (4) made from a flexible thin glass pane (2) and at least one carrier material pane (6), the panes having an electroconductive layer (8, 10) on respective faces facing each other, maintaining the opposing electroconductive layers (8, 10) at a distance to each other by a spacer (12), effecting contact between the electroconductive layers (8, 10) by applying pressure to the flexible thin glass pane (2) at an essentially localized area of pressure application, leading the electroconductive layers (8, 10) peripherally outwardly from between the thin glass pane (2) and the carrier material pane (6) by conductors (62, 66) at a side edge of the keyboard surface (4), electrically connecting flexible flat multiple side-by-side cables (64, 68) respectively with the conductors (62, 66) of the thin glass pane (2) and the carrier material pane (6) and gluing the flexible flat multiple cables (64, 68) respectively to the thin glass pane (2) and the carrier material pane (6), and subsequently gluing the thin glass pane (2) and the carrier material pane (6) to each other using an adhesive as a spacer (12) which at least in part sets-off gaps in each of which is housed conductors (74, 75) of said respective flat multiple cables (64, 68).

17. Method according to claim 16 characterized in that the flat multiple cables (64,68) are used as spacer (12) in the marginal area (20,28) of the thin glass pane (2) and the carrier material pane (6).

18. Method according to claim 16 characterized in that the outer edge in the marginal area (20) of the thin glass pane (2) is stabilized by means of a highly viscous and quick-curing plastic material (16) prior to joining the thin glass pane (2) and the carrier material pane (6).

19. Method according to claim 16 characterized in that the carrier material pane (6) is cut so as to be slightly larger than the flexible thin glass pane (2) such that the marginal area (28) of the carrier material pane (6) protrudes beyond the marginal area (20) of the thin glass pane (2).

* * * * *